United States Patent
Tehrani et al.

[11] Patent Number: 5,355,005
[45] Date of Patent: Oct. 11, 1994

[54] SELF-DOPED COMPLEMENTARY FIELD EFFECT TRANSISTOR

[75] Inventors: Saied Tehrani, Scottsdale; Jun Shen, Phoenix; Herbert Goronkin, Tempe; Robert Smith, Mesa, all of Ariz.

[73] Assignee: Motorola, Inc., Schaumburg, Ill.

[21] Appl. No.: 971,118

[22] Filed: Nov. 4, 1992

[51] Int. Cl.⁵ ................ H01L 31/072; H01L 29/06; H01L 31/109; H01L 29/80
[52] U.S. Cl. .................... 257/192; 257/24; 257/194; 257/274
[58] Field of Search .............. 257/12, 14, 20, 24, 257/27, 192, 194, 195, 274, 22, 25

[56] References Cited

U.S. PATENT DOCUMENTS

| | | | |
|---|---|---|---|
| 4,743,951 | 5/1988 | Chang et al. | 257/195 |
| 5,079,601 | 1/1992 | Esaki et al. | 257/22 |
| 5,113,231 | 5/1992 | Söderström et al. | 257/25 |
| 5,142,349 | 8/1992 | Zhu et al. | 257/24 |

Primary Examiner—Steven Ho Yen Loke
Attorney, Agent, or Firm—William E. Koch

[57] ABSTRACT

A complementary field effect structure having a first field effect device (26) including a quantum well having a first channel (12). A first doping region (14) is positioned adjacent to a first quantum well and a first gate electrode (29) is positioned so that the first doping region (14) is between the first gate electrode (29) and the first channel (12). A second field effect device (37) includes a second channel (22) and a second doping region (19) positioned adjacent to the second channel. A second gate electrode (31) is positioned over the second channel (22) so that the second channel (22) is between the second gate electrode (31) and the second doping region (19). An interconnect electrically couples the first gate electrode (29) to the second gate electrode (31).

12 Claims, 2 Drawing Sheets

SELF-DOPED COMPLEMENTARY FIELD EFFECT TRANSISTOR

BACKGROUND OF THE INVENTION

This invention relates, in general, to field effect transistors, and more particularly, to complementary field effect transistors having high mobility channels.

Conventional complementary metal oxide semiconductor (CMOS) technology offers many well known advantages including relatively low power loss during operation. CMOS circuits include an N-channel device and a P-channel device coupled in series so that only one device is "turned on" or conductive at a time. In steady state operation, one of the series coupled transistors is always turned off so that current and power loss are minimal. While this circuit arrangement is power efficient, silicon CMOS devices still suffer from switching power losses that occur while the devices change from one state to another.

Switching losses are an acute problem in modern high frequency integrated circuits. In high frequency circuits, many devices spend a high proportion of time in the high power loss switching regime, limiting many of the advantages of the CMOS circuit design. Because silicon CMOS devices use both N-channel and P-channel devices, any mismatch in P-channel and N-channel operating characteristics increases switching power loss. Moreover, P-channel devices have inherently lower mobility than N-channel devices, so their use reduces power efficiency. A complementary field effect transistor with closely matched operating characteristics and lower switching losses is needed.

SUMMARY OF THE INVENTION

Briefly stated, the advantages of the present invention are achieved by a complementary field effect structure having a first field effect device including a quantum well channel. A first doping region is positioned adjacent to the first quantum well and a first gate electrode is positioned so that the first doping region is between the gate electrode and the first channel. A second field effect device includes a quantum well channel and a second doping region positioned adjacent to the second quantum well. A second gate electrode is positioned over the second channel so that the second channel is between the gate electrode and the second doping layer. An interconnect electrically couples the first gate electrode to the second gate electrode.

DETAILED DESCRIPTION OF THE DRAWINGS

Figure 1:
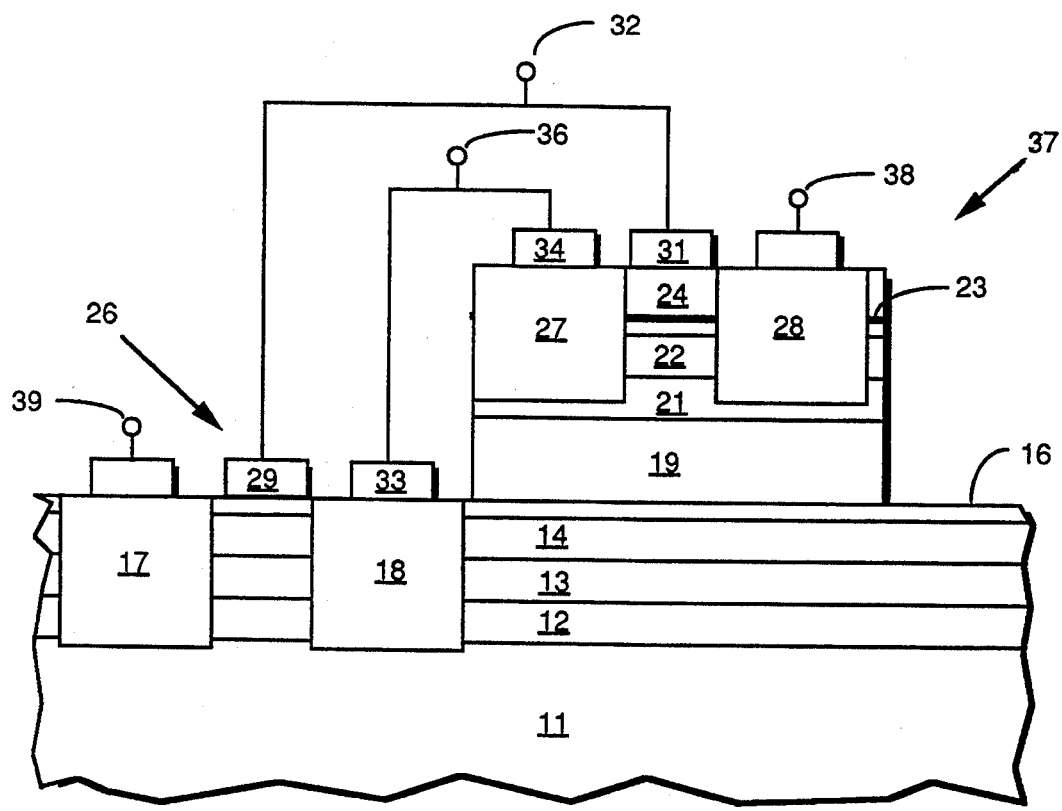
FIG. 1 illustrates a highly simplified cross section through a portion of a complementary field effect transistor in accordance with a first embodiment of the present invention.

A primary concern in design of quantum well field effect-transistors is the structure of channel regions underneath a gate electrode. The channel region performance largely determines overall performance of the transistor. FIG. 1 illustrates a highly simplified cross section through channel regions above a complementary heterojunction field effect transistor in accordance with the present invention. All material layers shown in FIG. 1, and subsequent embodiments of the present invention are substantially single crystal epitaxially grown layers. Each layer comprises a material that is crystalographically compatible with an underlying substrate. Therefore, in addition to electronic material constraints discussed hereinafter in regard to the particular embodiments, it should be noted that material choice is also limited by crystal properties. The epitaxial layers of the present invention may be grown by metal organic chemical vapor deposition (MOCVD), molecular beam epitaxy (MBE), or atomic layer epitaxy (ALE), or the like.

The preferred embodiment is described in terms of a self-doping structure. Conventional doping techniques, including modulation doping, may also be used at some sacrifice in device performance to augment the self-doping feature.

The embodiment shown in FIG. 1 comprises a wide band gap buffer layer 11 comprising a material such as aluminum antimonide (AlSb). Other wide band gap materials are known and used in compound semiconductor devices, but, as will be seen, AlSb is desirable in the preferred embodiments to ensure compatibility with other materials used in overlying layers of the preferred embodiments. A first channel 12 is formed covering AlSb buffer layer 11. In a preferred embodiment, channel 12 comprises indium arsenide (InAs) and is an N-type conductivity channel. Alternatively, channel 12 can comprise a material such as gallium antimonide to form a P-type conductivity channel. Channel 12 is covered by a spacer layer 13 having a predetermined thickness and comprising a material with a wide band gap such as AlSb.

Doping layer 14 comprises a material such as gallium antimonide (GaSb) when channel 12 comprises InAs. Similarly, if channel 12 comprises GaSb, doping layer 14 would comprise InAs. In the first preferred embodiment doping layer 14 is formed over spacer layer 13. A barrier layer 16 is formed over N-channel quantum well 14 and comprises a wide band gap material such as AlSb.

A second doping layer 19 is formed on barrier layer 16 and patterned to expose a portion of barrier 16. Second doping layer 19 comprises a material similar to first doping layer 14, such as GaSb, in the preferred embodiment. Doping layer 19 forms a foundation for a second field effect transistor 37 which is described in greater detail hereinafter. A portion of barrier layer 16 that is exposed after formation of second doping layer 19 forms an upper surface of a first field effect transistor 26.

Gate electrode 29 is formed on the exposed portion of second barrier 16 and makes a Schottky contact with second barrier layer 16. It should be noted that quantum well channel 12 is substantially undoped and that no charge supply layer need be placed in spacer layer 13, buffer layer 11, or barrier layer 16. Optionally, a charge supply layer or delta doping layer comprising extrinsic doping atoms can be provided to augment the self-doping feature of the present invention, but lower performance should be expected due to scattering caused by the extrinsic dopant atoms.

A drain region 17 having the same conductivity type as channel 12 is formed on a first side of gate electrode 29. Drain region 17 extends from the exposed surface of barrier layer 16 to channel 12. For example, when channel 12 is n-type conductivity InAs, drain region 17 is n-type conductivity. Source region 18 is formed on an opposite side of gate electrode 29 from drain region 17 and has the same conductivity type as channel 12. Source region 18 extends from the exposed surface of barrier layer 16 to channel 12. Ion implantation and thermal redistribution, or other well-known semiconductor doping techniques are suitable for the formation of drain region 17 and source region 18.

Figure 2:
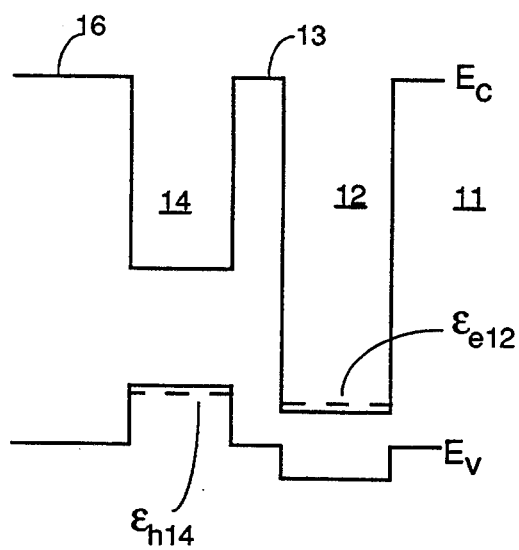
FIG. 2 illustrates a band diagram of a first portion of the structure shown in FIG. 1 with no applied bias.
Figure 3:
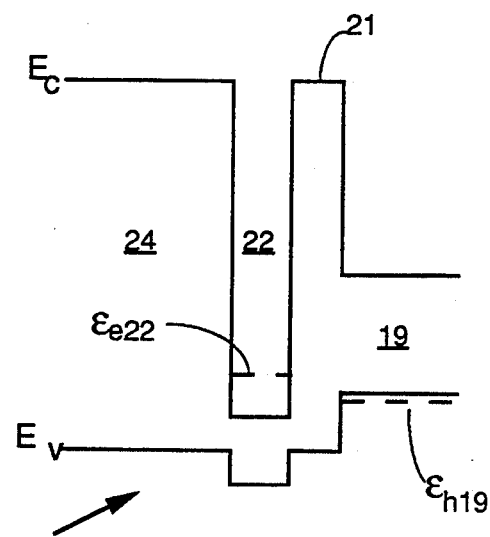
FIG. 3 illustrates a band diagram of a second portion of the structure shown in FIG. 1 with no applied bias.

Conduction band edge ($E_c$) and valence band edge ($E_v$) are illustrated in FIG. 2 and FIG. 3. The particular materials for channel 12 and doping region 14 are chosen because doping region 14 must have a valence band maximum energy greater than a conduction band minimum energy of channel 12. More specifically, doping region 14 should have a quantized hole state $\epsilon_{h14}$ greater than a quantized electron state $\epsilon_{e12}$ of channel 12 to provide self-doping, as shown in FIG. 2. When $\epsilon_{h14}$ is at a greater energy than $\epsilon_{e12}$, electrons in the valence band of doping layer 14 prefer the conduction band of channel 12, and thus dope channel 12 without the need for extrinsic doping atoms.

The thickness of barrier 13 is designed to allow overlap between the hole wave function in doping region 14 and the electron wave function in channel 12. In other words, barrier 13 is thin enough that charge carriers can couple between the two quantum wells. As channel 12 becomes thinner, $\epsilon_{e12}$ becomes more separated from $E_c$. Likewise, as doping region 14 becomes thinner, $\epsilon_{h14}$ becomes more separated from $E_v$. To account for the effects of quantized energy levels $\epsilon_{h14}$ and $\epsilon_{e12}$ that develop in thin quantum wells, in the preferred embodiment channel 12 and doping layer 14 are approximately 10 nanometers thick to ensure that channel 12 is doped when zero bias is applied to gate electrode 29.

In operation, charge is conducted between drain 17 and source 18 when channel 12 is doped. As set out before, channel 12 is doped with zero bias applied to gate electrode 29 in the preferred embodiment. Because doping region 14 lies between gate electrode 29 and channel 12, a positive bias applied to gate electrode 29 will lower the potential of doping region 14 with respect to channel 12. This has the effect of decreasing $\epsilon_{h14}$ in doping region 14 so that it becomes less than $\epsilon_{e12}$ in channel 12. Channel 12 thus becomes undoped and non-conductive when a positive voltage of predetermined magnitude is applied to gate electrode 29.

Referring again to FIG. 1, a second field effect transistor 37 is formed on the same substrate as and vertically isolated from first field effect transistor 26. Doping region 19 is covered by a spacer layer 21 comprising a wide bandgap material such as AlSb. Spacer layer 21 is in turn covered by channel 22, which in the first preferred embodiment comprises the same material as channel 12. For example, both channel 12 and channel 22 can comprise InAs. Channel 22 is preferably in the range of 5 to 10 nanometers thick.

Channel 22 is covered by a cap layer 24 comprising a wide bandgap material such as AlSb. As illustrated in FIG. 2, cap layer 24 optionally includes a delta doping layer 23 or doping region 23 (illustrated as a bold line in FIG. 1) positioned sufficiently near channel 22 to provide charge carriers to channel 22. Delta doping layer 23 comprises extrinsic doping atoms such as silicon.

A gate electrode 31 is formed on an upper portion of cap layer 24 and makes a Schottky contact with cap layer 24. A drain region 27 having the same conductivity type as channel 22 is formed on a first side of gate electrode 31. For example, when channel 22 is n-type conductivity InAs, drain region 27 is n-type conductivity. Source region 28 is formed on an opposite side of gate electrode 31 from drain region 27 and has the same conductivity type as channel 22. Drain region 27 and source region 28 extend from an exposed surface of cap layer 24 to channel 22. Ion implantation and thermal redistribution, or other well-known semiconductor doping techniques are suitable for the formation of drain region 27 and source region 28.

At a late stage in processing, a conductive material is deposited and patterned so that drain electrode 39 is formed making ohmic contact to drain region 17, source electrode 33 makes ohmic contact to source region 18, drain electrode 34 makes ohmic contact to drain region 27, and source electrode 38 makes ohmic contact to source region 28. In a preferred embodiment, a conductive interconnect is formed coupling gate electrode 29 and gate electrode 31 to provide input 32. Also, the conductive material is patterned to interconnect source electrode 33 and drain electrode 34 to provide output 36. In the preferred embodiment, drain electrode 39 is for coupling to a first external voltage and source electrode 38 is for coupling to a second external voltage, such as a ground or common potential.

FIG. 3 shows a band diagram illustrating operation of second field effect transistor 37. Because channel 22 is thin, a quantized energy state $\epsilon_{e22}$ develops that is separated from $E_C$ by a significant amount. Because $\epsilon_{e22}$ is greater than $\epsilon_{h19}$ in doping region 19, channel 22 is undoped with zero bias applied to gate electrode 31. In other words, with zero bias applied to gate electrode 31, field effect transistor 37 is off. Channel 22 is positioned between gate electrode 31 and doping region 19 so that when gate electrode 31 is made sufficiently positive with respect to channel 22 $\epsilon_{e22}$ is pushed downward with respect to $\epsilon_{h19}$ and channel 22 becomes doped and conductive.

A notable feature of the complementary field effect transistor structure in accordance with the present invention is that both transistors can have n-type conductivity channels. Not only does this result in improved matching between devices, but because electrons have higher mobility than holes, two n-type conductivity channels will have better performance than a more typical n-channel/p-channel complementary transistor structure. Moreover, the nature of the materials used and the self-doping process results in a tremendous quantity of charge carriers being transferred between doping regions 14 and 19 to channels 12 and 22 so that once self-doping has occurred, charge carrier concentration is quite high in each of the quantum wells and conductivity is correspondingly high. Also, channels 12 and 22 are free of doping impurities and thus achieve very close to their intrinsic mobility. Unlike conventionally doped quantum wells, when $\epsilon_h$ is less than $\epsilon_e$ a forbidden energy gap exists between $\epsilon_h$ and $\epsilon_e$. This forbidden energy gap is expected to produce low leakage when the channels are in a non-conductive state.

Figure 4:
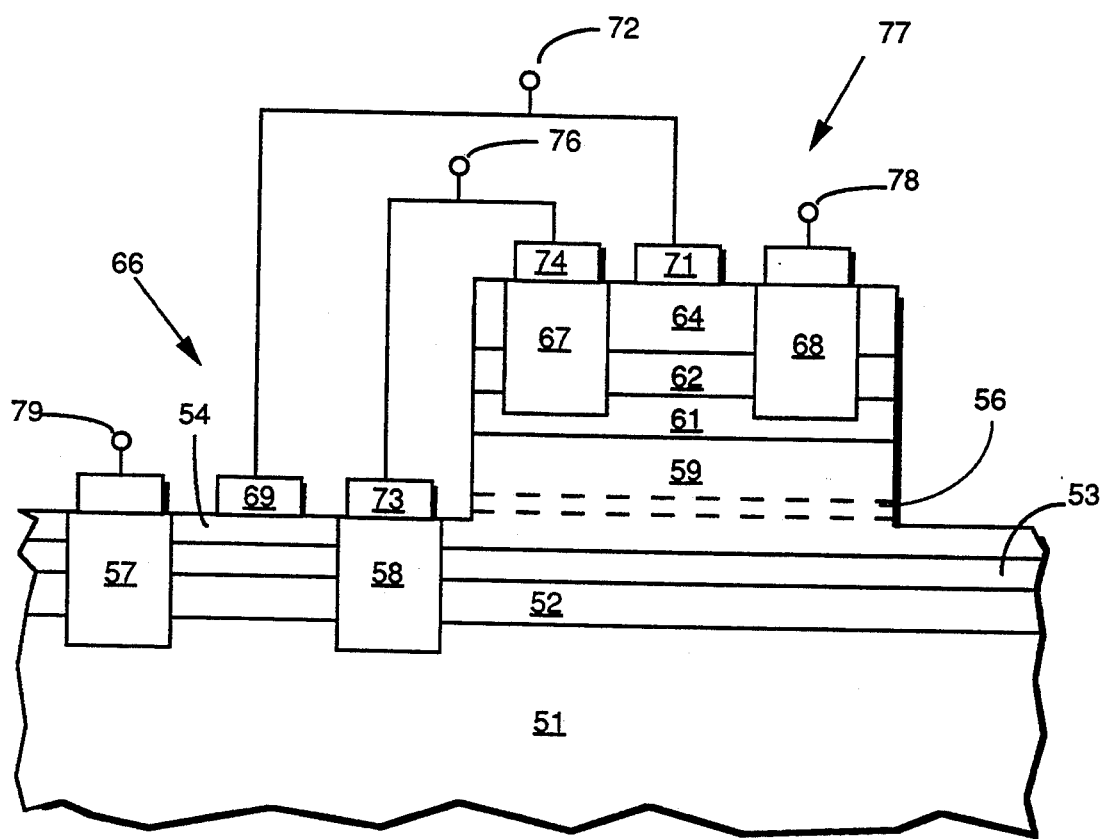
FIG. 4 illustrates a highly simplified cross section through a portion of a complementary field effect transistor in accordance with a second embodiment of the present invention.

FIG. 4 illustrates a second embodiment complementary field effect transistor structure in accordance with the present invention. The structure shown in FIG. 4 includes both n-channel transistor 77 and p-channel transistor 66 and so does not have all of the advantages of the first preferred embodiment. The n-channel/p-channel combination shown in FIG. 4 may be useful in some applications, however.

Substrate 51 is similar to substrate 11 described in reference to FIG. 1. P-channel transistor 66 includes a doping region 52 comprising a material such as InAs. Doping region 52 is covered by a spacer region 53 comprising a wide bandgap material such as AlSb. A channel 54 is formed covering spacer region 53 and comprises a material such as GaSb. Drain region 57 and source region 58 comprise regions doped to the same conductivity type as channel 54 and are formed on opposed sides of a gate electrode 69.

N-channel transistor 77 is substantially similar to transistor 37 described in reference to FIG. 1. N-channel transistor 77 includes a doping region 59 comprising a material such as GaSb. Optionally, a wide bandgap layer 56 comprising a material such as AlSb can separate doping region 59 from channel 54 to provide improved isolation between FET 77 and FET 66. Doping region 59 is covered by spacer layer 61 comprising a wide bandgap material such as AlSb. Spacer layer 61 is in turn covered by n-channel 62 comprising a material such as InAs, and a wide bandgap cap layer 64. Drain region 67 and source region 68 are regions doped to the same conductivity type as channel 62 and formed on opposed sides of gate electrode 71. Drain region 67 and source region 68 extend from a surface of cap layer 64 to channel 62. Source electrode 73 and drain electrode 74 are electrically coupled to form an output 76. Gate electrodes 69 and 71 are coupled by a conductive interconnect to form input 72.

P-channel transistor 66 is designed to be conductive with zero bias applied to gate electrode 69. This is done by making channel 54 thick (greater than ten nanometers). This structure results in a bandgap diagram that is substantially similar to FIG. 2, and differs from n-channel transistor 26 in FIG. 1 primarily in that the p-type quantum well is the channel. Because channel 54 is positioned between gate electrode 69 and doping region 52, a positive bias applied to gate electrode 69 pushes hole energy states in channel 54 lower than electron energy states in doping region 52, so that channel 54 becomes undoped. In other words, a sufficient positive bias applied to gate electrode 69 turns p-channel transistor 66 off while turning n-channel transistor 77 on.

By now it should be appreciated that a self-doped complementary heterojunction field effect transistor with improved performance is provided. The structure in accordance with the present invention allows optimal use of superior materials for complementary transistor technology as well as superior matching between complementary portions of the structure. Moreover, by allowing the use of two n-channel devices, maximum efficiency can be achieved by utilization of the naturally high mobility of electrons.

We claim:

1. A self-doping complementary field effect transistor comprising:
    a first field effect transistor including a first channel of a first conductivity type sandwiched between two wide bandgap regions; a first doping region positioned adjacent to the first channel; a first gate electrode positioned over a portion of the first channel for controlling charge transfer between the first doping region and the first channel, wherein the first doping region is between the first gate electrode and the first channel;
    a second field effect transistor including a second channel of the first conductivity type sandwiched between two wide bandgap regions; a second doping region positioned adjacent to the second channel; a second gate electrode positioned over a portion of the second channel for controlling charge transfer between the second doping region and the second channel, wherein the second channel is between the second gate electrode and the second doping region; and
    an interconnect electrically coupling the first gate electrode to the second gate electrode.

2. The self-doping complementary field effect transistor of claim 1 further comprising a wide bandgap barrier layer covering the first doping region and separating the first gate electrode from the first doping region, wherein the second field effect transistor is formed on top of the wide bandgap barrier layer and electrically isolated from the first field effect transistor by the wide bandgap barrier layer.

3. The self-doping complementary field effect transistor of claim 1 further comprising:
    a first drain region of the first conductivity type formed adjacent to the first gate electrode extending to the first channel;
    a first source region of the first conductivity type formed adjacent to the first gate electrode and on an opposite side of the first gate electrode from the first drain region and extending to the first channel;
    a second drain region of the first conductivity type formed adjacent to the second gate electrode extending to the second channel; and
    a second source region of the first conductivity type formed adjacent to the second gate electrode and on an opposite side of the second gate electrode from the second drain region and extending to the second channel.

4. The self-doping complementary field effect transistor of claim 3 further comprising a conductive interconnect coupling the first source region to the second drain region.

5. The self-doping complementary field effect transistor of claim 1 wherein the first and second channels comprise indium arsenide and the first and second doping regions comprise gallium antimonide.

6. The self-doping complementary field effect transistor of claim 1 wherein the first doping region has a valence band maximum energy greater than a conduction band minimum energy of the first channel.

7. The self-doping complementary field effect transistor of claim 1 wherein the second doping region has a valence band maximum energy greater than a conduction band minimum energy of the second channel.

8. A self-doping complementary field effect transistor comprising: a crystal substrate; a first channel covering the substrate; a first spacer layer covering the first channel, wherein the first spacer layer comprises a wide bandgap material; a first doping layer covering the first spacer layer; a barrier layer covering the first doping layer, wherein the barrier layer comprises a wide bandgap material; a second doping layer covering a first portion of the barrier layer, wherein a second portion of the barrier layer remains exposed; a first gate electrode positioned on the exposed portion of the barrier layer, wherein electrons in the first doping layer transfer to the first channel when a first predetermined voltage is applied to the first gate electrode; a first source region positioned on one side of the first gate electrode and extending from the exposed surface of the barrier layer to the first channel; a first drain region positioned on a side of the first gate electrode opposite the first source region and extending from the exposed surface of the barrier layer to the first channel; a second spacer layer covering the second doping layer, wherein the second spacer layer comprises a wide bandgap material; a second channel covering the second spacer layer; a cap layer covering the second channel, wherein the cap layer comprises a wide bandgap material; a second gate electrode positioned on the cap layer, wherein charge carriers in the second doping layer transfer to the second channel when a second predetermined voltage is applied to the second gate electrode; a second source region positioned on one side of the second gate electrode and extending from the cap layer to the second channel; and a second drain region positioned on a side of the second gate electrode opposite the second source region and extending from the cap layer to the second channel.

9. The self-doping complementary field effect transistor of claim 1 wherein the first and second gate electrodes are electrically coupled and the first source region is coupled to the second drain region.

10. The self-doping complementary field effect transistor of claim 9 further comprising a drain electrode coupled to the first drain region for coupling to a first external voltage and a source electrode coupled to the second source region for coupling to a second external voltage.

11. The self-doping complementary field effect transistor of claim 10 wherein the first and second channels comprise indium arsenide and the first and second doping layers comprise gallium antimonide.

12. The self-doping complementary field effect transistor of claim 8 further comprising a delta-doping layer formed in the cap layer.

* * * * *

UNITED STATES PATENT AND TRADEMARK OFFICE
CERTIFICATE OF CORRECTION

PATENT NO. : 5,355,005
DATED : October 11, 1994
INVENTOR(S) : Tehrani et al.

It is certified that error appears in the above-indentified patent and that said Letters Patent is hereby corrected as shown below:

Column 8, claim 9, line 5, delete "1" and insert therefor --8--.

Signed and Sealed this

Twenty-first Day of November, 1995

Attest:

BRUCE LEHMAN

*Attesting Officer*     *Commissioner of Patents and Trademarks*